United States Patent [19]

House

[11] Patent Number: 5,022,488

[45] Date of Patent: Jun. 11, 1991

[54] TRANSDUCER ENCLOSURE

[75] Inventor: William N. House, Bloomington, Ind.

[73] Assignee: Harman International Industries, Incorporated, Northridge, Calif.

[21] Appl. No.: 409,006

[22] Filed: Sep. 18, 1989

[51] Int. Cl.[5] .............................................. H05K 5/00

[52] U.S. Cl. .................................... 181/156; 381/184

[58] Field of Search ............... 181/144, 145, 156, 160, 181/199, 150; 381/182, 184, 186, 188, 205

[56] References Cited

U.S. PATENT DOCUMENTS

| | | | |
|---|---|---|---|
| 2,923,370 | 2/1960 | De Capite | 181/145 |
| 3,283,848 | 11/1966 | Patti | 181/145 |
| 4,122,315 | 10/1978 | Schroeder et al. | 381/186 |

*Primary Examiner*—Brian W. Brown

*Attorney, Agent, or Firm*—Barnes & Thornburg

[57] ABSTRACT

An enclosure (10) for mounting two transducers (12, 14) includes a wall (20, 22) defining an enclosure (10) interior. The enclosure (10) also includes a wall (54 and/or 56) for dividing the enclosure (10) interior into a first portion (16) and a second portion (18). The enclosure (10) wall (20 and/or 22) includes a vent (52) for venting one of the first (16) and second (18) portions outside the enclosure (10), and a vent (74) for venting the other of the first (16) and second (18) portions outside the enclosure (10). The enclosure (10) further comprises a step (38) for mounting a transducer (12) perimetral edge. The step (38) extends inwardly from the enclosure (10) wall (20 and/or 22) into the enclosure (10) interior. The vent (52) for venting one of the first (16) and second (18) enclosure portions is provided between the step (38) and the back of the enclosure (10).

9 Claims, 2 Drawing Sheets

TRANSDUCER ENCLOSURE

This invention relates to transducer enclosures and particularly to enclosures for mounting two or more acoustical transducers, one for transducing lower frequency electrical signals and one for transducing higher frequency electrical signals. The enclosure of the present invention is disclosed in the context of audio loudspeakers.

The benefits of shallow loudspeaker mounting hardware, such as loudspeaker frames or baskets, are known and are dealt with in some detail in Patent Cooperation Treaty Publication No. W088/08239, which is incorporated herein by reference.

Prior art multi-loudspeaker assemblies, such as those used in automotive applications, typically utilize low frequency transducers that have upper cutoff frequencies in the range of 2-5 KHz. This is generally due to restrictions imposed on the associated higher frequency drivers at frequencies lower than 2-5 KHz. At frequencies lower than this, a higher frequency driver of this type requires an enclosure to eliminate front-to-rear wave cancellation. The enclosure volume must be large enough to avoid loading the higher frequency driver at low frequencies, thus reducing its low frequency output. Conversely, the enclosure size must be small enough to package in the assembly. When confronted by these trade-offs, the speaker designer generally chooses to leave the higher frequencY driver unenclosed and drive it only at the higher frequencies. Thus the lower frequency driver must handle program material up to 2-5 KHz.

If the lower frequency driver has an upper cutoff of 2-5 KHz and produces substantial output energy, below 100 Hz or so, large acoustic intermodulation (IM) distortion will be produced. This problem is compounded in automotive applications, where a 10-20 dB low frequency boost is required to overcome road noise.

If a prior art assembly is used in a biamplification system, the frequency spectrum division between the lower frequency driver and higher frequency driver is not nearly optimal. The lower frequency driver and its amplifier will dissipate many times more power than the higher frequency driver and its amplifier. This is due to the large power requirements at low frequencies and the greater energy density contained in the midband region, i.e., the 2-5 KHz region, of music signals. There will be no appreciable acoustic or electrical IM distortion reduction in the 200 Hz - 5 KHz region, which is of prime importance to the quality of the reproduced signal.

Also, due to the relatively larger low frequency transducer piston size, the power response decreases as the signal frequency increases. This can produce an appreciable loss of sound energy from 2 KHz to 5 KHz for off-axis angles greater than 30° .

According to the invention, an enclosure for mounting two transducers includes a sidewall and a back wall. The sidewall projects forward from the back wall toward the front of the enclosure. The back wall and sidewall define an interior within their dimensions. A section through the sidewall parallel to the back wall defines a generally closed plane curve. The enclosure includes means for defining at least partially within the interior a wall for dividing the interior into a first portion and a second portion. Means are provided in at least one of the enclosure sidewall and rear wall for venting one of the first and second portions outside the enclosure. Means are also provided in at least one of the enclosure sidewall and rear wall for venting the other of the first and second portions outside the enclosure.

Illustratively, the means provided in at least one of the enclosure sidewall and rear wall for venting one of the first and second portions outside the enclosure comprises means for venting the first enclosure portion rearward from the enclosure. The enclosure further comprises means for mounting a transducer perimetral edge. The transducer perimetral edge mounting means extends inwardly from the enclosure sidewall. The means for venting the first enclosure portion is provided between the transducer perimetral edge mounting means and the back of the enclosure.

Further, illustratively, the enclosure sidewall comprises enclosure mounting means extending from the outside of the enclosure sidewall. The enclosure mounting means defines a surface facing toward the front of the enclosure. The means provided in at least one of the enclosure sidewall and rear wall for venting the other of the first and second portions outside the enclosure comprises means for venting the second enclosure portion through the sidewall of the enclosure. According to an illustrative embodiment, the means for venting the second enclosure portion through the sidewall of the enclosure comprises means for venting the second enclosure portion on the side of the enclosure mounting means opposite the forward facing surface of the enclosure mounting means.

According to another illustrative embodiment, the means for venting the second enclosure portion through the sidewall of the enclosure comprises means for venting the second enclosure portion on the side of the enclosure mounting means opposite the rearward facing surface of the enclosure mounting means.

The invention may best be understood by referring to the following detailed description and accompanying drawings which illustrate the invention. In the drawings.

Figure 1:
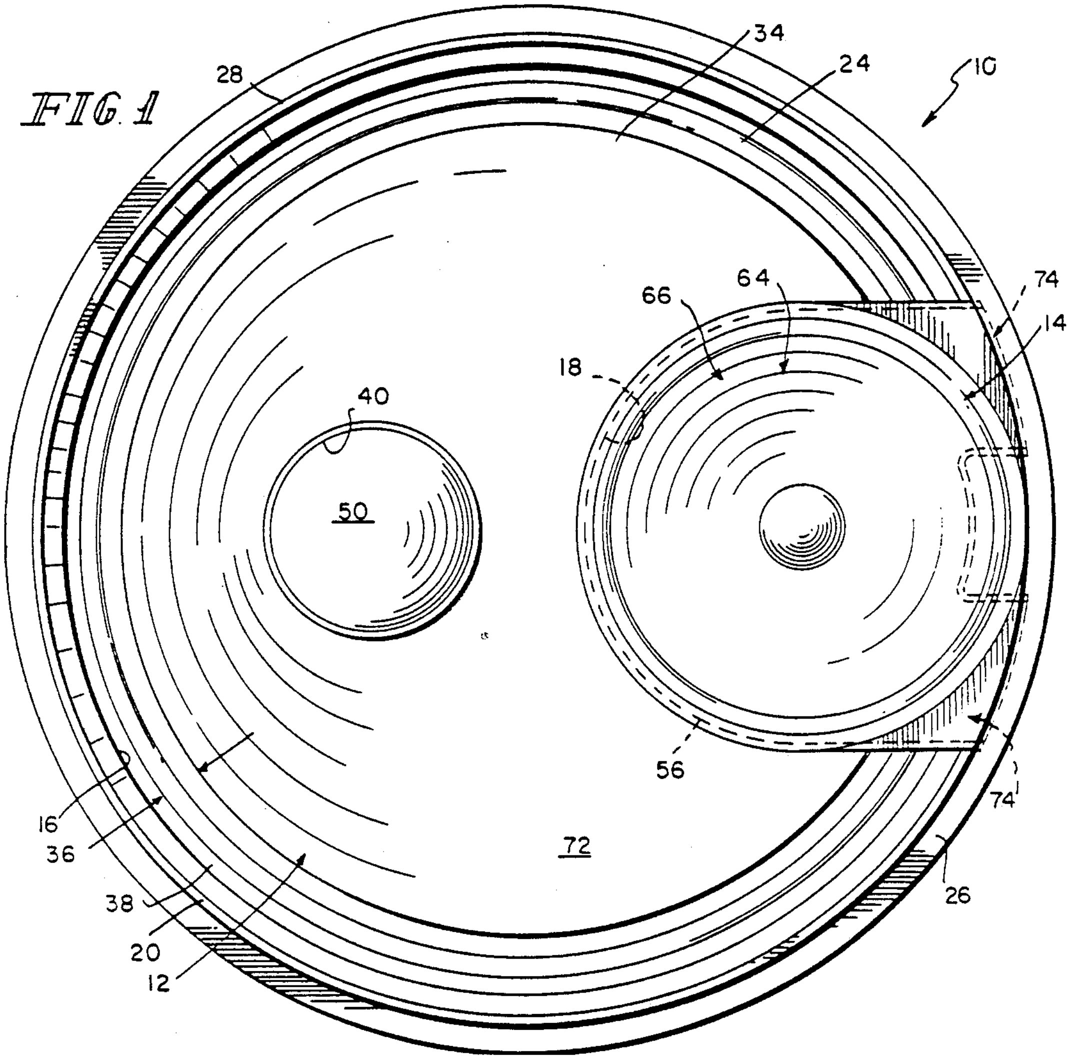
FIG. 1 illustrates a front view of a transducer enclosure according to the present invention, housing in one portion thereof an asymmetrical lower frequency transducer and in the other portion thereof a symmetrical higher frequency transducer.

An enclosure 10 for an asymmetrical lower frequency audio transducer or woofer 12 and a higher frequency audio transducer or tweeter 14 is separated acoustically into a woofer enclosure portion 16 and a tweeter enclosure portion 18. Enclosure 10 comprises a generally right circular cylindrical sidewall 20, a generally flat circular rear wall 22 and an open front 24. A mounting flange 26 projects radially outwardly from the outer surface 28 of sidewall 20. The woofer 12 includes a woofer magnet structure 30 which projects from the inner surface 32 of rear wall 22 forward toward front 24. Woofer 12 also includes an asymmetrical diaphragm 34 mounted at its perimeter by a compliance ring 36 from a radially inwardly projecting supporting ring 38 provided on the inside of enclosure 10 at the junction of sidewall 20 and rear wall 22. Woofer diaphragm 34 is provided with an offset opening 40 in which is mounted a right circular cylindrical voice coil form 42. Coil form 42 supports a voice coil (not shown) in a right circular cylindrical air gap (now shown) provided in magnet structure 30. The supply of electrical current at audio frequencies causes axial motion of the voice coil and form 42 and diaphragm 34 between the excursion limits 46, 48, illustrated in broken lines in FIG. 2, of form 42 and diaphragm 34. A dust cap 50 covers the front end of coil form 42. The back side of woofer diaphragm 34 is vented through vent holes 52 provided in rear wall 22.

Tweeter enclosure portion 18 is formed integrally in enclosure 10 with woofer enclosure portion 16. Tweeter enclosure portion 18 comprises a somewhat conically shaped rear wall 54 and a generally right circular cylindrical sidewall 56. A tweeter magnet structure 60 projects from the inner surface 62 of rear wall 54 forward toward the front 24. Tweeter 14 includes a symmetrical, generally frustoconical diaphragm 64 mounted at its perimeter by a compliance ring 66 from a front surface 68 provided on tweeter enclosure portion 18.

Figure 2:
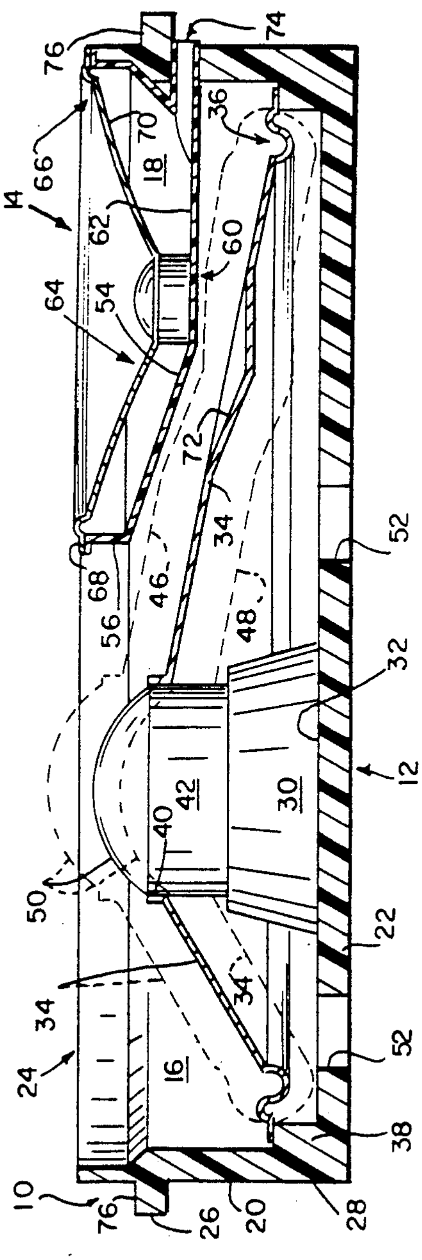
FIG. 2 illustrates a sectional view of the enclosure and transducers of FIG. 1, taken generally along section lines 2—2 thereof; and, FIG. 3 illustrates a sectional view of an alternative construction to the enclosure and transducers illustrated in FIG. 2.
Figure 3:
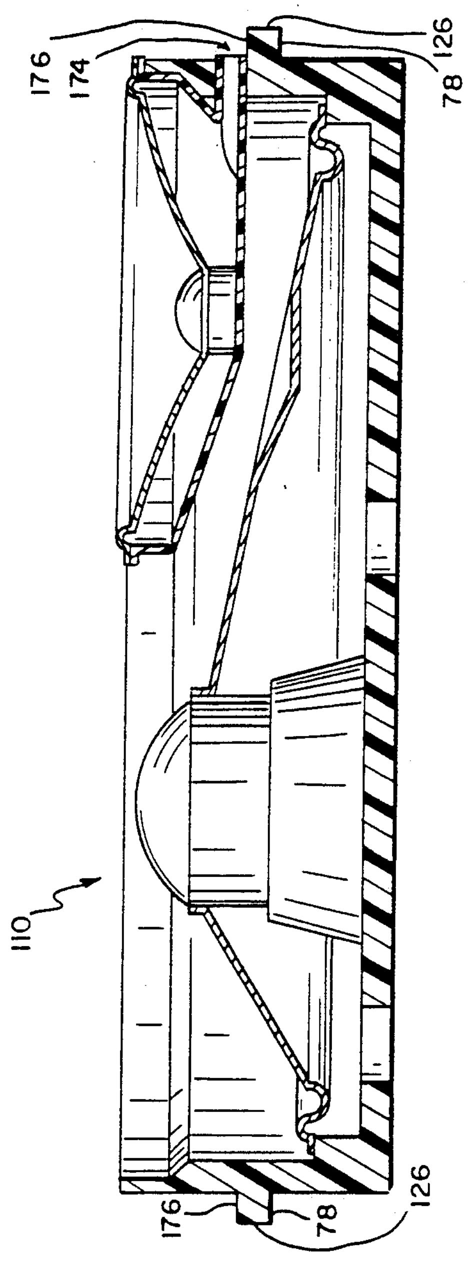

Rather than having the rear side 70 of tweeter diaphragm 64 radiate onto the front surface 72 of woofer diaphragm 34, enclosure portion 18 is vented as illustrated at 74 outside enclosure 10 through sidewall 20 behind mounting flange 26. Depending upon the geometry of the baffle into which enclosure 10 is to be mounted, vents 74 can open through sidewall 22 behind flange 26, as illustrated in FIG. 2, or in front of it, as illustrated in FIG. 3. That is, the enclosure 10 of FIG. 2 is suitable for mounting from behind a baffle, with the front 76 of flange 26 contacting the rear of the baffle. In this way, interference by the baffle with venting through vents 74 is avoided. Conversely, the enclosure 110 of FIG. 3 is intended for mounting from the front of a baffle so that contact between the baffle and flange 126 occurs on surface 78 of flange 126, and vents 174 are placed on the surface 176 side of flange 126 rather than on the surface 78 side.

As used in this description, the terms woofer and tweeter are illustrative only. The enclosure of the present invention can be employed with any two transducers handling any ranges (or, indeed, the same range) of frequencies in any situation in which back radiation from the front transducer is to be prevented from impinging on the rear transducer. In the same way, the terms front and rear, as used herein, have been assigned arbitrarily and are not intended to limit the scope of the invention.

While the tweeter 14 is illustrated as being of the same general construction as woofer 12, that is, a moving coil transducer, tweeter 14 need not be a moving-coil type. It could, for example, be an electrostatic type, a piezoelectric type, or some other type. Similarly, although transducers 12, 14 are illustrated as being perimetrally mounted, they, or either of them, could be free-edge type diaphragms. Additionally, it is not necessary for diaphragm 34 to be asymmetrical, nor for diaphragm 64 to be symmetrical, nor for either transducer to be a diaphragm type at all.

What is claimed is:

1. An enclosure for mounting two tranducers (12, 14), the enclosure (10) including a wall (20, 22) defining an enclosure (10) interior, the enclosure (10) further including means for defining at least partially within the enclosure (10) interior a wall (54 and/or 56) for dividing the enclosure (10) interior into a first portion (16) and a second portion (18), means (52) provided in the enclosure (10) wall (20 and/or 22) for venting one of the first (16) and second (18) portions outside the enclosure (10), and means (74) provided in the enclosure (10) wall (20 and/or 22) for venting the other of the first (16) and second (18) portions outside the enclosure (10), the enclosure (10) further comprising means (38) for mounting a transducer (12) perimetral edge, the transducer (12) perimetral edge mounting means extending inwardly from the enclosure wall (20 and/or 22) into the enclosure (10) interior, the means (52) for venting one of the first (16) and second (18) enclosure portions being provided between the transducer (12) perimetral edge mounting means (38) and a back of the enclosure (10).

2. The apparatus of claim 1 wherein the enclosure (10) wall (20 and/or 22) comprises an outside surface (28) and an inside surface, the enclosure (10) outside surface (28) including enclosure (10) mounting means (26) extending from the enclosure (10) outside surface (28), the enclosure (10) mounting means (26) defining a surface (76) facing toward a front (24) of the enclosure (10).

3. The apparatus of claim 2 wherein the means (74) for venting the second enclosure portion (18) through the wall (20, 22) of the enclosure (10) comprises means (74) for venting the second enclosure portion (18) on the side of the enclosure mounting means (26) opposite the forward facing surface (76) of the enclosure mounting means (26).

4. The apparatus of claim 2 wherein the means (74) for venting the second enclosure portion (18) through the wall (20, 22) of the enclosure (10) comprises means (74) for venting the second enclosure portion (18) on the side of the enclosure mounting means opposite the rearward facing surface (78) of the enclosure mounting means (26).

5. In combination, a first transducer (12) for transducing a first portion of a program from electrical signal to audio signal, a second transducer (14) for transducing a second portion of the program from electrical signal to audio signal, each of the first (120 and second (14) transducers having a forward radiating surface (72), an opposite rearward radiating surface (70) and a mounting region (36, 66) from which the first and second transducers (12, 14, respectively) are to be supported in an enclosure (10, 110), and an enclosure (10, 110) for supporting the first (12) and second (14) transducers by the respective mounting regions (36, 66) of the first and second transducers, the enclosure (10, 110) including first wall means (20, 22) for defining the enclosure (10, 110) interior and for providing a front opening (24) in the enclosure (10, 110), second wall means (54, 56) for dividing the enclosure (10, 110) interior into a first interior portion (16) and a second interior portion (18) and for dividing the enclosure (10, 110) front opening (24) into a first front opening portion and a second front opening portion, first mounting means (38) for engaging the mounting region (36) of the first transducer (12) to support the first transducer (12) in the first enclosure portion (16) with the first transducer's (12) forward radiating surface (72) facing the first front opening portion, second mounting means (68) for engaging the mounting region (66) of the second transducer (14) to support the second transducer (14) in the second enclosure portion (18) with the second transducer's (14) forward radiating surface (72) facing the second front opening portion, means (52) for providing a first vent from the first enclosure portion (16) through the first wall means (20, 22) for venting radiation from the rearward radiating surface (70) of the first transducer (12), and means (74) for providing a second vent from the second enclosure portion (18) through the first wall means (20, 22) for venting radiation from the rearward radiating surface (70) of the second transducer (14).

6. The combination of claim 5 wherein the first wall means (20, 22) includes an exterior surface (28) and means (26) for mounting the enclosure (10), the enclosure (10) mounting means (26) extending outwardly from the exterior surface (28) and having a forward facing enclosure (10) mounting surface (76) facing generally toward the front opening (24) of the enclosure (10).

7. The combination of claim 5 wherein the first wall (20, 22) includes an exterior surface and means (126) for mounting the enclosure (110), the enclosure (110) mounting means (126) extending outwardly from the exterior surface and having a rearward facing enclosure mounting surface (78) facing in a direction generally opposite the front opening of the enclosure (110).

8. In combination, a first transducer (12) for transducing a first portion a program from electrical signal to audio signal, a second transducer (14) for transducing a second portion of the program from electrical signal to audio signal, each of the first (12) and second (14) transducers having a forward radiating surface (72), an opposite rearward radiating surface (70) and a mounting region (36, 66) from which said first and second transducers (12, 14, respectively) are to be supported in an enclosure (10), and an enclosure (10) for supporting the first (12) and second (14) transducers by said mounting regions (36, 66), the enclosure (10) including first wall means (20 and/or 22) for defining the enclosure (10) interior and for providing a front opening (24) in the enclosure (10), second wall means (54 and/or 56) for dividing the enclosure (10) interior into a first interior portion (16) and a second interior portion (18) and for dividing the enclosure (10) front opening (24) into a first front opening portion and a second front opening portion, first mounting means (38) for engaging the mounting region (36) of the first transducer (12) to support the first transducer (12) in the first enclosure portion (16) with the first transducer's (12) forward radiating surface (72) facing the first front opening portion, second mounting means (68) for engaging the mounting region (66) of the second transducer (14) to support the second transducer (14) in the second enclosure portion (18) with the second transducer's (14) forward radiating surface (72) facing the surface front opening portion, means for providing a first vent (52) from the first enclosure portion (16) through the first wall means (20 and/or 22) for venting radiation from the rearward radiating surface (70) of the first transducer (12), and means for providing a second vent (74) from the second enclosure portion (18) through the first wall means (20 and/or 22) for venting radiation from the rearward radiating surface (70) of the second transducer (14), the first wall means (20 and/or 22) including an exterior surface (28) and means (26) for mounting the enclosure (10, the enclosure (10) mounting means (26) extending outwardly from the exterior surface (28) and having a forward facing enclosure (10) mounting surface (76) facing generally toward the front opening (24) of the enclosure (10), the means for providing the second vent (74) providing the second vent (74) on a side of the enclosure (10) mounting means (26) opposite the forward facing enclosure (10) mounting surface (76).

9. In combination, a first transducer (12) for transducing a first portion of a program from electrical signal to audio signal, a second transducer (14) for transducing a second portion of the program from electrical signal to audio signal, each of the first (12) and second (14) transducers having a forward radiating surface (72), an opposite rearward radiating surface (70) and a mounting region (36, 66) from which said first and second transducers (12, 14, respectively) are to be supported in an enclosure (110), and an enclosure (110) for supporting the first (12) and second (14) transducers by said mounting regions (36, 66), the enclosure (110) including first wall means (20 and/or 22) for defining the enclosure (110) interior and for providing a front opening (24) in the enclosure (110), second wall means (54 and/or 56) for dividing the enclosure (110) interior into a first interior portion (16) and a second interior portion (18) and for dividing the enclosure (110) front opening (24) into a first front opening portion and a second front opening portion, first mounting means (38) for engaging the mounting region (36) of the first transducer (12) to support the first transducer in the first enclosure portion (16) with the first transducer's (12) forward radiating surface (72) facing the first front opening portion, second mounting means (68) for engaging the mounting region (66) of the second transducer (14) to support the second transducer (14) in the second enclosure portion (18) with the second transducer's (14) forward radiating surface (72) facing the second front opening portion, means for providing a first vent (52) from the first enclosure portion (16) through the first wall means (20 and/or 22) for venting radiation from the rearward radiating surface (70) of the first transducer (12), and means for providing a second vent (174) from the second enclosure portion (18) through the first wall means (20 and/or 22) for venting radiation from the rearward radiating surface (70) of the second transducer (14), the first wall means (20 and/or 22) including an exterior surface and means (126) for mounting the enclosure (110), the enclosure (110) mounting means (126) extending outwardly from the exterior surface and having a rearward facing enclosure mounting surface (78) facing in a direction generally opposite the front opening of the enclosure (110), the means for providing the second vent (174) providing the second vent (174) on a side of the enclosure (110) mounting means (126) opposite the rearward facing enclosure (110) mounting surface (78).

* * * * *